(12) United States Patent
O'Donnell et al.

(10) Patent No.: US 7,994,957 B2
(45) Date of Patent: Aug. 9, 2011

(54) CURRENT STEERING DIGITAL-TO-ANALOG CONVERTER

(75) Inventors: John Jude O'Donnell, Quin (IE); Frederick Carnegie Thompson, Foynes (IE)

(73) Assignee: MediaTek Singapore Pte. Ltd. (SG)

( * ) Notice: Subject to any disclaimer, the term of this patent is extended or adjusted under 35 U.S.C. 154(b) by 13 days.

(21) Appl. No.: 12/560,602

(22) Filed: Sep. 16, 2009

(65) Prior Publication Data
US 2010/0328124 A1 Dec. 30, 2010

Related U.S. Application Data

(60) Provisional application No. 61/221,658, filed on Jun. 30, 2009.

(51) Int. Cl.
*H03M 1/66* (2006.01)
(52) U.S. Cl. ......................... 341/144; 341/155
(58) Field of Classification Search ................ 341/144, 341/141, 143, 61
See application file for complete search history.

(56) References Cited

U.S. PATENT DOCUMENTS

| | | | | |
|---|---|---|---|---|
| 4,972,188 A * | 11/1990 | Clement et al. | ............... | 341/118 |
| 5,880,689 A * | 3/1999 | Kushner | ............... | 341/144 |
| 6,061,010 A | 5/2000 | Adams et al. | ............... | 341/144 |
| 6,466,143 B2 * | 10/2002 | Eshraghi et al. | ............... | 341/68 |
| 6,977,602 B1 * | 12/2005 | Ostrem et al. | ............... | 341/145 |
| 7,193,547 B2 * | 3/2007 | Ho et al. | ............... | 341/144 |
| 7,206,359 B2 * | 4/2007 | Kjeldsen et al. | ............... | 375/316 |
| 7,221,298 B1 * | 5/2007 | Persons | ............... | 341/120 |
| 7,224,304 B2 * | 5/2007 | Schoner | ............... | 341/144 |
| 7,777,658 B2 * | 8/2010 | Nguyen et al. | ............... | 341/143 |
| 2006/0139193 A1 | 6/2006 | Morrow et al. | ............... | 341/143 |

FOREIGN PATENT DOCUMENTS
EP 1 453 206 1/2004

OTHER PUBLICATIONS

Clara et al., "A 350MHz Low-OSR ΔΣ Current—Steering DAC With Active Termination in 0.13 μm CMOS", ISSCC 2005/Session 6/High-Speed and Oversampled DACs/6.5, 2005 IEEE International Solid-State Circuits Conference, Feb. 2005, pp. 118-119, 588.

(Continued)

*Primary Examiner* — Peguy JeanPierre
(74) *Attorney, Agent, or Firm* — Fish & Richardson P.C.

(57) ABSTRACT

A digital to analog converter (DAC) module receives an input digital signal having a first data rate and is associated with a first frequency, the DAC module also receiving a synchronization signal having a second frequency that is higher than the first frequency. The DAC module includes an up-sampling circuit to generate a first digital signal having bit values of the input digital signal alternating with zero values, the first digital signal having a data rate that is higher than the first data rate; a delay circuit to delay the first digital signal by a time period to generate a second digital signal; a first DAC cell to generate a first analog signal based on the first digital signal, the first DAC cell being synchronized by the synchronization signal; a second DAC cell to generate a second analog signal based on the second digital signal, the second DAC cell being synchronized by the synchronization signal; and an adder to sum the first and second analog signals and generate a third analog signal.

27 Claims, 6 Drawing Sheets

OTHER PUBLICATIONS

Nguyen et al., "A 108 dB SNR, 1.1 mW Oversampling Audio DAC With A Three-level DEM Technique", IEEE Journal of Solid-State Circuits, vol. 43, No. 12, Dec. 2008, pp. 2592-2600.

Nguyen et al., "A 113dB SNR Oversampling Sigma-Delta DAC for CD/DVD Application", IEEE 1998, vol. 44, No. 3, Aug. 1998, pp. 1019-1023.

Van Tuijl et al., "A 128f, Multi-Bit ΣΔ CMOS Audio DAC With Real-Time DEM and 115dB SFDR", ISSCC 2004/Session 20/Digital-To-Analog Converters/20.5, IEEE International Solid-State Circuits Conference, Feb. 18, 2004, 8 pages.

Adams et al., "A 113dB SNR Oversampling DAC With Segmented Noise-Shaped Scrambling", ISSCC98/Session 4/Oversampling Converters/Paper TP 4.3, 1998 IEEE International Solid-State Circuits Conference, Digest of Digital Papers, Feb. 5, 1998, pp. 62-63, 413.

Nguyen et al., "A 113dB SNR Oversampling Sigma-Delta DAC for CD/DVD Application", THPM 24.3, IEEE, Mar. 1998, pp. 404-405.

Nguyen et al., "A 108dB SNR 1.1mW Oversampling Audio DAC With A Three-level DEM Technique", ISSCC 2008/Session 27/ΔΣ Data Converters/27.1, IEEE International Solid-State Circuits Conference, Feb. 6, 2008, Digest of Digital Papers, pp. 488-489, 630.

PCT Search Report, PCT Application No. PCT/EP2010/058175, dated Oct. 14, 2010.

* cited by examiner

Negative Logic Data

| Dinp | Dinn | code |
|---|---|---|
| 0 | 0 | X |
| 0 | 1 | +1 |
| 1 | 0 | -1 |
| 1 | 1 | 0 |

| Dinp | Dinn | code |
|---|---|---|
| 0 | 0 | 0 |
| 0 | 1 | -1 |
| 1 | 0 | +1 |
| 1 | 1 | X |

FIG. 7

| Dinp | Dinn | code |
|---|---|---|
| 0 | 0 | -1 |
| 0 | 1 | X |
| 1 | 0 | 0 |
| 1 | 1 | +1 |

FIG. 8

CURRENT STEERING DIGITAL-TO-ANALOG CONVERTER

RELATED APPLICATION

This application claims priority to U.S. Provisional Application No. 61/221,658, filed Jun. 30, 2009, the contents of which are incorporated herein by reference.

BACKGROUND

This description relates to digital-to-analog converters.

In some examples, a current steering digital-to-analog converter (DAC) includes weighted current sources whose outputs are directed to an output terminal using switches. The switches are controlled by digital input signals, and the outputs of the current sources are summed to form the analog output signal.

SUMMARY

In general, in one aspect, a digital to analog converter (DAC) module receives an input digital signal having a first data rate and is associated with a first frequency, and alternately samples the input digital signal and a zero value signal at a second frequency that is higher than first frequency to generate an up-sampled digital signal. A delay circuit delays the up-sampled digital signal to generate a delayed up-sampled digital signal. A first phase DAC unit converts the up-sampled digital signal to a first analog signal, a second phase DAC unit converts the delayed up-sampled digital signal to a second analog signal, and the first and second analog signals are summed to generate a third analog signal that is representative of the input digital signal. The first and second phase DAC units are synchronized by a single clock signal having the second frequency.

The DAC module can have one or more of the following advantages. The DAC module can have small or no inter-symbol interference and small or no jitter errors. The DAC module can be used in a sigma-delta DAC with a multi-bit continuous-time output stage.

In general, in another aspect, an apparatus includes a digital to analog converter (DAC) module that receives an input digital signal having a first data rate and associated with a first frequency, the DAC module also receiving a synchronization signal having a second frequency that is higher than the first frequency. The DAC module includes an up-sampling circuit to generate a first digital signal having bit values of the input digital signal alternating with zero values, the first digital signal having a data rate that is higher than the first data rate; a delay circuit to delay the first digital signal by a time period to generate a second digital signal; a first DAC cell to generate a first analog signal based on the first digital signal, the first DAC cell being synchronized by the synchronization signal; a second DAC cell to generate a second analog signal based on the second digital signal, the second DAC cell being synchronized by the synchronization signal; and an adder to sum the first and second analog signals and generate a third analog signal.

Implementations of the apparatus may include one or more of the following features. The first DAC cell can include a first latch unit to latch the first digital signal, the second DAC cell can include a second latch unit to latch the second digital signal, and timing of latching the first digital signal by the first latch unit and timing of latching the second digital signal by the second latch unit can be controlled by a same control signal. The control signal can be the synchronization signal.

The first DAC cell can include a current steering circuit to steer a current from a current source based on the first digital signal to generate the first analog signal. The current steering circuit can include NMOS transistors for steering currents from a positive current source and NMOS transistors for steering currents to a negative current source. The apparatus can include a logic circuit to receive the input digital signal and generate control signals for controlling the NMOS transistors to affect steering of the currents.

The synchronization signal can be a clock signal, and the delay circuit can delay the first digital signal by one clock cycle of the clock signal.

The first DAC cell can include a tri-level current source.

The up-sampling circuit can include a multiplexer that receives the input digital signal and a zero value signal, and alternately outputs the digital signal and the zero value signal.

In general, in another aspect, an apparatus includes a digital to analog converter (DAC) module that receives an input digital signal and a synchronization signal. The DAC module includes a first circuit to sample a first digital signal and a second digital signal synchronously according to the synchronization signal, the first digital signal having bit values of the input digital signal alternating with zero values, the second digital signal being a time-delayed version of the first digital signal; and a second circuit to convert the first and second digital signals into first and second analog signals, and to combine the first and second analog signals to generate a third analog signal.

Implementations of the apparatus may include one or more of the following features. The input digital signal has a first data rate and is associated with a first frequency, and the synchronization signal has a second frequency that is higher than first frequency.

In general, in another aspect, an apparatus includes a digital to analog converter (DAC) module that receives an input digital signal having a first data rate and is associated with a first frequency, the DAC module also receiving a clock signal having a clock frequency that is higher than the first frequency. The DAC module includes at least one DAC unit, and each DAC unit includes a first current source, a second current source, a first control circuit to steer current from the first current source according to a first digital signal that includes bit values of the input digital signal interleaved with zero values, the first control circuit being synchronized according to the clock signal, and a second control circuit to steer current from the second current source according a second digital signal that includes the first digital signal delayed by a time period, the second control circuit being synchronized according to the clock signal.

Implementations of the apparatus may include one or more of the following features. The first control circuit can include a first latch unit to latch the first digital signal, the second control circuit can include a second latch unit to latch the second digital signal, and timing of latching the first digital signal by the first latch unit and timing of latching the second digital signal by the second latch unit can be controlled by a same latch control signal.

Each DAC unit can convert one bit in the input digital signal to analog components.

The combination of the first current source and the first control circuit can include a first tri-level current steering circuit, and the combination of the second current source and the second control circuit can include a second tri-level current steering circuit.

The latch control signal can include the clock signal.

The DAC module can combine the currents steered from the first and second current sources to form an analog output signal.

The first control circuit and the second control circuit can be synchronized according to same edges of the clock signal.

The first control circuit can receive the first digital signal and generate control signals to control switches that steer the current from the first current source.

The first digital signal can include a bit value from a scrambled thermometer code.

In general, in another aspect, an apparatus includes a sigma-delta modulator to receive a parallel input bit stream and generate an over-sampled bit stream having a data rate higher than that of the input bit stream and a number of parallel bits lower than that of the input bit stream; a thermometer encoder to encode the over-sampled bit stream to generate a thermometer coded bit stream; and a plurality of weighted digital to analog units each to generate an analog representation of one or more bits of the thermometer coded bit stream. The weighted digital to analog unit includes a first logic circuit synchronized to a clock signal twice the frequency of the thermometer coded bit stream to control a first source according to a first digital signal that includes bit values of the corresponding bit of the thermometer coded bit stream interleaved with zero values, and a second logic circuit synchronized to the clock signal to control a second source according to a second digital signal that includes the first digital signal delayed by a time period.

Implementations of the apparatus may include one or more of the following features. The first logic circuit can include a first latch unit to latch the first digital signal, the second logic circuit can include a second latch unit to latch the second digital signal, and timing of latching the first digital signal by the first latch unit and timing of latching the second digital signal by the second latch unit can be controlled by a same latch control signal.

The latch control signal can include the clock signal.

The first logic circuit can control switches to steer current from the first source in one of three ways to generate a tri-level analog signal.

The switches can include NMOS transistors that steer current from a positive source and NMOS transistors that steer current from a negative source.

In general, in another aspect, an apparatus includes a digital to analog converter (DAC) to receive input digital data and generate a corresponding analog tri-level output signal. The DAC includes a tri-level component includes at least one current source and transistor switches to steer current in one of three ways, the transistor switches all being of a same polarity type; and a logic circuit to receive the input digital data and generate control signals to control the transistor switches to cause the tri-level component to output the analog tri-level output signal.

Implementations of the apparatus may include one or more of the following features. The tri-level component can include NMOS transistors to steer current from both positive and negative current sources.

The logic circuit can generate a first signal that controls a first transistor switch and a second transistor switch, a second signal that controls a third transistor switch and a fourth transistor switch, and a third signal that controls a fifth transistor switch and a sixth transistor switch.

The logic circuit can include three latches to hold values of input digital data and three latch control switches to control when the three latches receive new input digital data, the values of input data held by the three latches corresponding to the first, second, and third signals, respectively.

The latch control switches can be synchronized by a clock signal having a frequency that is higher than the frequency associated with the input digital data.

The logic circuit can include a first input to receive a first digital data, a second input to receive a second digital data, and one or more logic gates to generate a third digital data based on the first and second digital data. The first, second, and third digital data can have specific values that correspond to each of three possible levels of the analog tri-level output signal.

In general, in another aspect, a method of converting a digital code to an analog signal includes receiving an input digital signal having a first data rate and associated with a first frequency; generating a first digital signal that includes bit values of the input digital signal interleaved with zero values and having a second data rate that is higher than the first data rate; delaying the first digital signal by a time period to generate a second digital signal; converting the first digital signal to a first analog signal; converting the second digital signal to a second analog signal; and combining the first and second analog signals.

Implementations of the method may include one or more of the following features. Converting the first digital signal to the first analog signal and converting the second digital signal to the second analog signal can include sampling the first digital signal to generate a first sampled signal, sampling the second digital signal to generate a second sampled signal, controlling timing of sampling of the first and second digital signals using a synchronization signal having a clock frequency that is higher than the first frequency, converting the first sampled signal to the first analog signal, and converting the second sampled signal to the second analog signal.

Converting the first digital signal to the first analog signal can include steering a current from a current source based on the first digital signal to generate the first analog signal.

Steering the current from a current source can include controlling NMOS transistors to steer currents from a positive current source and controlling NMOS transistors for steering currents to a negative current source.

The method can include receiving the input digital signal and generating control signals for controlling the NMOS transistors to affect steering of the currents.

The method can include receiving a clock signal having a frequency that is higher than the first frequency, the clock signal synchronizing conversion of the first digital signal to the first analog signal and conversion of the second digital signal to the second analog signal.

Delaying the first digital signal can include delaying the first digital signal by one clock cycle of the clock signal.

Converting the first digital signal to a first analog signal can include generating a fist tri-level analog signal.

In general, in another aspect, a method includes receiving an input digital signal and a synchronization signal; generating a first digital signal having bit values of the input digital signal alternating with zero values; delaying the first digital signal to generate a second digital signal; sampling the first digital signal and the second digital signal synchronously according to the synchronization signal to generate a first sampled signal and a second sampled signal, respectively; converting the first and second sampled signals into first and second analog signals, and combining the first and second analog signals to generate a third analog signal.

Implementations of the method may include one or more of the following features. Receiving the input digital signal can include receiving an input digital signal having a first frequency, generating the first digital signal can include generating a first digital signal having a second frequency that is higher than the first frequency, and sampling the first and second digital signals synchronously according to the synchronization signal can include sampling the first and second digital signals synchronously according to a synchronization signal having a frequency equal to the second frequency.

These and other aspects and features, and combinations of them, may be expressed as methods, apparatus, systems, means for performing functions, program products, and in other ways.

Advantages of the aspects and features may include one or more of the following. Digital signals can be accurately converted to analog signals with low noise. Errors due to clock jitter can be reduced or eliminated. Inter-symbol interference can be reduced or eliminated. Control logic for generating control signals for controlling transistor switches for steering current from current sources can be made simple.

DESCRIPTION OF DRAWINGS

FIG. 5 shows an example table.
FIGS. 7 and 8 show example tables.

DETAILED DESCRIPTION

A digital to analog converter (DAC) module receives an input digital signal having a first data rate and associated with a first frequency, and alternately samples the input digital signal and a zero value signal at a second frequency that is higher than the first frequency to generate an up-sampled digital signal. In some examples, the second frequency is at least twice the first frequency. A delay circuit delays the up-sampled digital signal by a time period (e.g., one clock cycle of the second frequency) to generate a delayed up-sampled digital signal. A first phase DAC unit converts the up-sampled digital signal to a first analog signal, a second phase DAC unit converts the delayed up-sampled digital signal to a second analog signal, and the first and second analog signals are summed to generate a third analog signal that is representative of the input digital signal. The first and second phase DAC units are synchronized by a single clock signal having the second frequency. The DAC module can have small or no inter-symbol interference and small or no jitter errors. For example, the DAC module can be used in a sigma-delta DAC with a multi-bit continuous-time output stage.

In some implementations, the input digital signal is a multi-bit signal, and the input data are encoded and scrambled to generate control signals used to control several tri-level DAC cells. The analog outputs from the DAC cells are summed to generate an analog signal that is representative of the input digital signal. For example, the input data can be encoded into positive and negative thermometer data that are scrambled and used to generate negative logic data that are latched and used to control NMOS transistor steering switches in the tri-level DAC cells.

A feature of the DAC module is that the up-sampled digital signal and the delayed up-sampled digital signal can be converted to analog signals by using circuits that are synchronized to the same clock edges of the same clock signal (which has twice the frequency associated with the input digital signal in this example), thereby implementing a dual-return-to-zero (DRTZ) DAC with inherently improved inter-phase timing compared with an example conventional DRTZ DAC. In an example conventional DRTZ DAC, conversion of the up-sampled digital signal and the delayed up-sampled digital signal to analog signals may not be synchronized to the same clock edges of the same clock signal. Another feature of the DAC module is that, by using tri-level DAC cells using NMOS transistors to steer currents from both positive and negative current sources, the control circuit for generating the control signals for controlling the NMOS transistors can be made simpler than if PMOS and NMOS transistors were used to steer currents from positive and negative sources, respectively.

Figure 1:
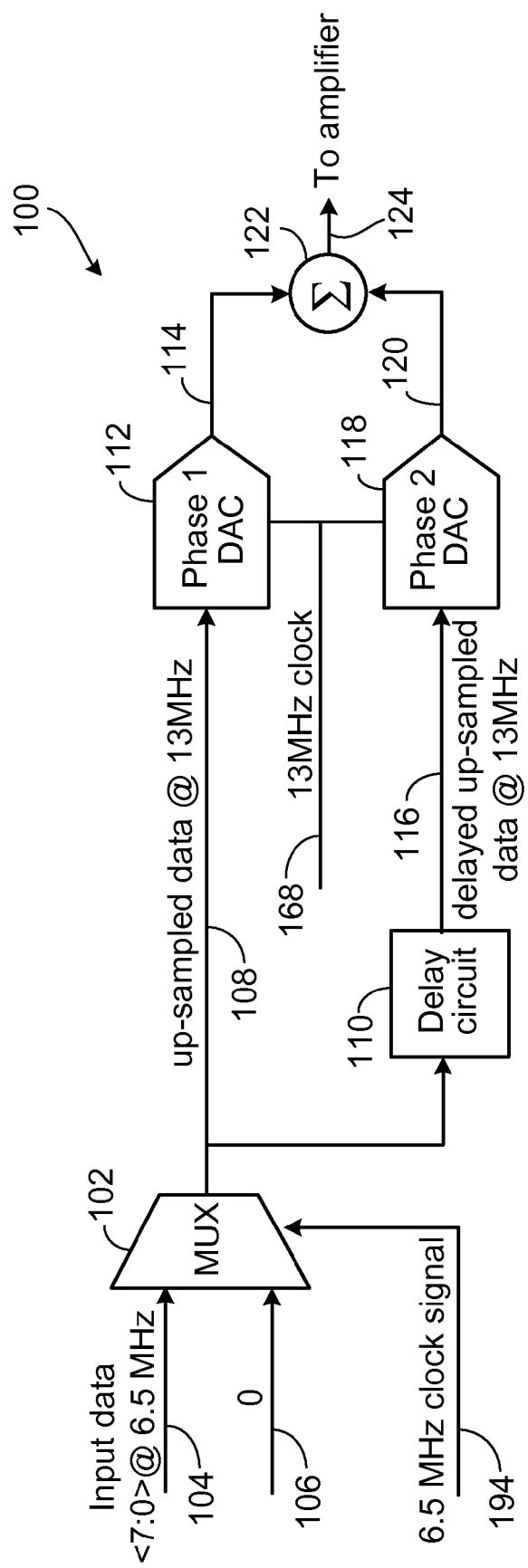
FIG. 1 is a diagram of an example digital to analog converter (DAC) module.

Referring to FIG. 1, in some implementations, a digital to analog converter module 100 includes a multiplexer 102 that multiplexes an input digital signal 104 with a zero value signal 106 to generate an up-sampled signal 108 having twice the frequency as the input signal 104. The input digital signal 104 can be, e.g., one or more bits of a thermometer code digital signal or a binary-weighted digital signal. For example, the multiplexer 102 receives a clock signal 194 as a control signal, in which the clock signal 194 has a frequency that is the same as the frequency associated with the input digital signal 104. The multiplexer 102 outputs the input signal 104 when the clock signal 194 is at a high level, and outputs zero when the clock signal 194 is at a low level. For example, the input digital signal can have a data rate of 6.5 Mbits/second and associated with a clock frequency of 6.5 MHz, and the up-sampled signal can have a data rate of 13 Mbits/second and associated with a clock frequency of 13 MHz. Other data rates and frequencies can also be used.

In this description, when we say "the frequency associated with a digital signal" we mean the frequency of a clock signal that can be used to synchronize the digital signal. For example, when a 6.5 Mbits/second digital signal is sent from a sender to a receiver, the sender uses a clock signal having a frequency of 6.5 MHz to synchronize the digital signal, and the receiver uses a clock signal having a frequency of 6.5 MHz to synchronize the digital signal, so the frequency associated with digital signal having a bit rate of 6.5 Mbits/second is 6.5 MHz.

In some implementations, the DAC module 100 can use circuits other than a multiplexer to insert the zeros. For example, digital circuitry employing registers running from the first frequency and second frequency clocks can be used.

The up-sampled signal 108 is sent to a first phase DAC cell 112, which generates a first analog signal 114 representative of the up-sampled digital signal 108. The up-sampled signal 108 is also sent to a delay circuit 110, which generates a delayed up-sampled signal 116. The delayed up-sampled signal 116 is sent to a second phase DAC cell 118, which generates a second analog signal 120 representative of the delayed up-sampled digital signal 116. The first phase DAC cell 112 and the second phase DAC cell 118 can be driven by a clock signal 168 that has a frequency that is twice the frequency of the input digital signal 104. For example, the clock signal 168 can have a frequency of 13 MHz. The first and second analog signals 114 and 120 are summed by an adder 122 to generate a third analog signal 124 that is representative of the input digital signal 104. The third analog signal 124 can be sent to an amplifier that drives an output stage. The data presented to the DAC cell 112 is sufficiently delayed so that it does not change while the internal DAC latch is in "transparent" mode such that the data can be properly latched in the DAC cell 112.

Figure 2:
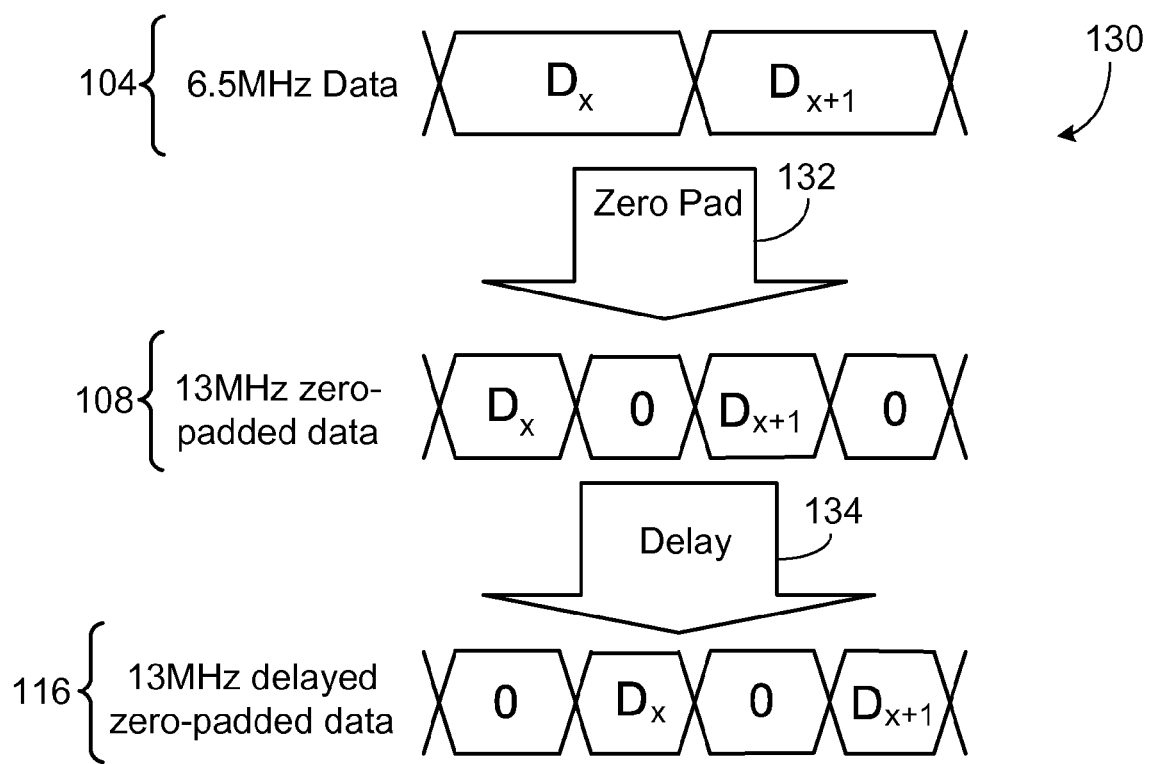
FIG. 2 is an example logic timing diagram.

FIG. 2 is a logic timing diagram 130 showing that the input digital signal 104, after being interleaved with zeros (132), becomes the up-sampled digital signal 108 having a data rate that is twice the data rate of the input digital signal 104. The up-sampled digital signal 108, after being delayed (134) by the delay circuit 110, becomes the delayed up-sampled digital signal 116.

In some examples, an N-bit (N being a positive integer) binary weighted digital signal can be converted into an analog signal by sending the N bits of the digital signal to N binary-weighted digital to analog converters 100, in which the digital to analog converters 100 have binary weighted current sources (referred to as positive current sources) and current sinks (referred to as negative current sources). The outputs from the DACs 100 are summed to generate the analog signal.

In some examples, an N-bit thermometer code can be converted to an analog signal by sending the N bits of the thermometer code to N or fewer digital to analog converters 100 having positive and negative current sources of the same weight.

In some examples, an N-bit code can be converted to an analog signal by sending the N bits of the thermometer code to N or fewer digital to analog converters having positive and/or negative current sources weighted according to a predetermined segmentation scheme.

In some examples, a multi-bit input digital signal can be encoded and/or scrambled and used to generate control signals for controlling steering switches in tri-level DAC cells. For example, the digital signals can be thermometer codes. Other types of encoding can also be used.

Figure 3:
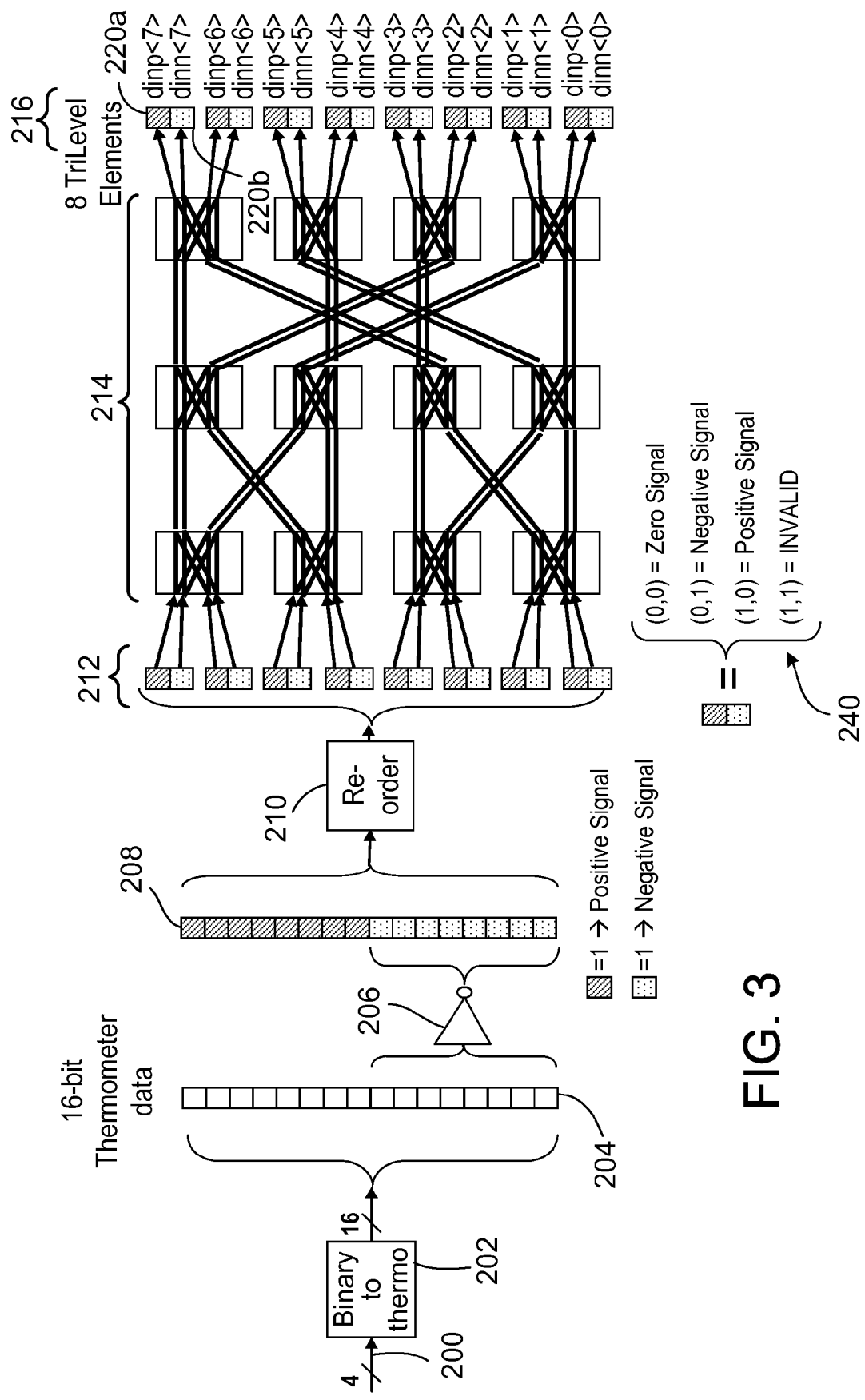
FIG. 3 is a diagram of a portion of an example digital to analog converter module.

Referring to FIG. 3, in some examples, a 4-bit binary weighted data 200 is converted to a 16-bit thermometer code using a binary to thermometer encoder 202. Eight bits in the thermometer code are inverted by an inverter 206, resulting in a signed thermometer code 208 that can have positive and negative codes. Bits in the signed thermometer code 208 are-ordered 210 to generate re-ordered code 212 having pairs of positive and negative code, each pair representing a positive signal, a negative signal, or a zero signal, as shown in the legend 240. The re-ordered pairs of positive and negative code 212 are scrambled by scrambler cells 214 to generate scrambled codes 216 having pairs of positive and negative codes (e.g., 220a and 220b). In this example, there are eight pairs of positive and negative codes, labeled as (dinp<7>, dinn<7>), (dinp<6>, dinn<6>), (dinp<5>, dinn<5>), (dinp<4>, dinn<4>), (dinp<3>, dinn<3>), (dinp<2>, dinn<2>), (dinp<1>, dinn<1>), (dinp<0>, dinn<0>). For understanding of the concept, it is helpful to note that if any 2-bit tri-level signal has a positive value then there will be no 2-bit tri-level with a negative value. It is also helpful to note that a 2 bit tri-level signal cannot have both the +1 and −1 value simultaneously.

In some implementations, the scrambler cells 214 can use positive logic (e.g., a '1' is used to indicate that an element is to be turned on), while DAC cells 228 (see FIG. 4) use negative logic circuit (e.g., a '0' indicates a current source is to be turned on). A logic circuit having inverters can be provided to convert the positive and negative thermometer codes 216 to signals dinp 220a and dinn 220b (see FIG. 4) that are sent to the DAC cells 228.

Figure 4:
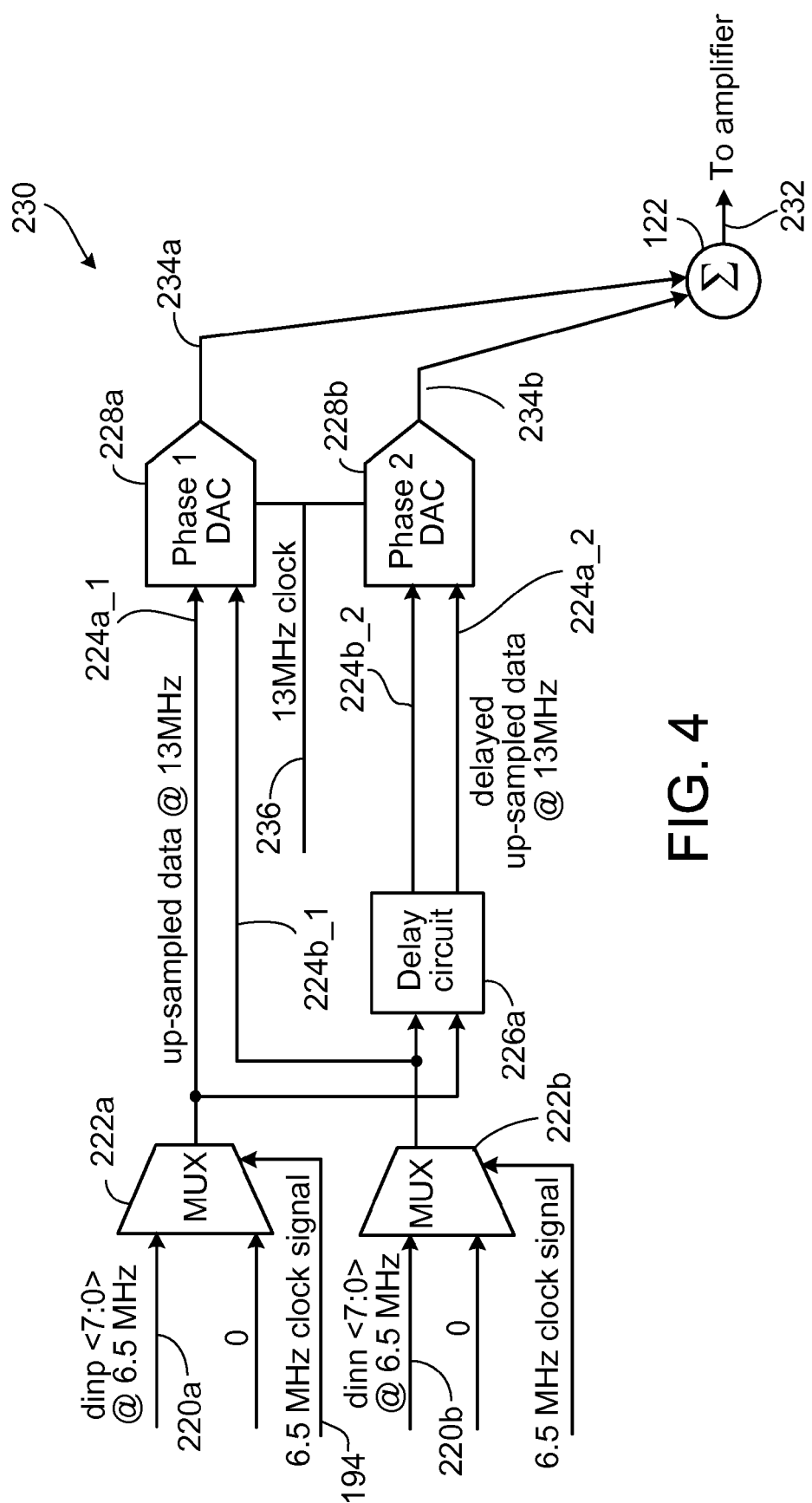
FIG. 4 is a diagram of example DAC modules.

Referring to FIG. 4, a DAC module 230 converts the scrambled thermometer codes 216 to an analog signal 232. Each pair of positive code (e.g., digital_input_positive, or dinp<x> 220a) and negative code (e.g., digital_input_negative, or dinn<x> 220b) represents a tri-level signal. In the example of FIG. 4, each of the positive signal dinp 220a and the negative signal dinn 220b is a parallel 8-bit signal, and dinp<x> or dinn<x> represents one bit of the dinp or dinn signal, respectively, x ranging from 0 to 7. A multiplexer 222a interleaves zeros into the positive signal dinp<7:0>220a to generate up-sampled signal 224a_1. The up-sampled signal 224a_1 is delayed by a delay circuit 226a to form delayed up-sampled signal 224a_2. A multiplexer 222b interleaves zeros into the negative signal dinn<7:0>220b to generate up-sampled signal 224b_1. The up-sampled signal 224b_1 is delayed by the delay circuit 226a to form a delayed up-sampled signal 224b_2.

The up-sampled signals 224a_1 and 224b_1 are sent to a first phase DAC cell 228a to generate a first analog signal 234a. The delayed up-sampled signals 224a_2 and 224b_2 are sent to a second phase DAC cell 228b to generate a second analog signal 234b. The first and second phase DAC cells 228a and 228b are both synchronized by the same clock signal 236. In this example, the positive and negative thermometer signals dinp and dinn are clocked at 6.5 MHz, and the clock signal 236 has a frequency of 13 MHz. Other frequencies can also be used.

The clock signal 236 can have clock edges that slightly lag the clock edges of the clock signal 194 used to control the multiplexers 222a and 222b to take into account the delays caused by the multiplexers 222 and one or more logic gates in the first and second phase DAC cells 228a and 228b. The relationship between the edges of the clock signal 236 and the data is such that data is presented to the DAC cells 228 during the clock phase that keeps the output of the DAC cells 228 latched. This renders the DAC cells 228 unaffected by coarse timing variations in the data (e.g., 224a_1, 224a2, 224b_1, and 224b_2).

A feature of the DAC module 230 is that both the first phase DAC cell 228a and the second phase DAC cell 228b are synchronized by the same clock signal 236. This reduces or eliminates errors in the output analog signal due to clock jitter, which may occur if the DAC cells 228a and 228b are synchronized by two different clock signals (or by a first clock signal and a second clock signal in which the second clock signal is an inverted or time-delayed version of the first clock signal).

The analog signals 234a and 234b are summed by an adder 122 to generate the analog signal 232 that is representative of the input digital signal 200 (FIG. 3).

Referring to FIG. 5, a table 150 shows the relationship between the pair of signals dinp<x> 220a and dinn<x> 200b, and a tri-level code 242. In this example, the positive and negative signals dinp 220a and dinn 220b are configured as negative logic data. The values (dinp, dinn)=(0, 1) represent a positive signal (e.g., +1), (dinp, dinn)=(1, 0) represent a negative signal (e.g., −1), and (dinp, dinn)=(1, 1) represent a zero signal.

Figure 6:
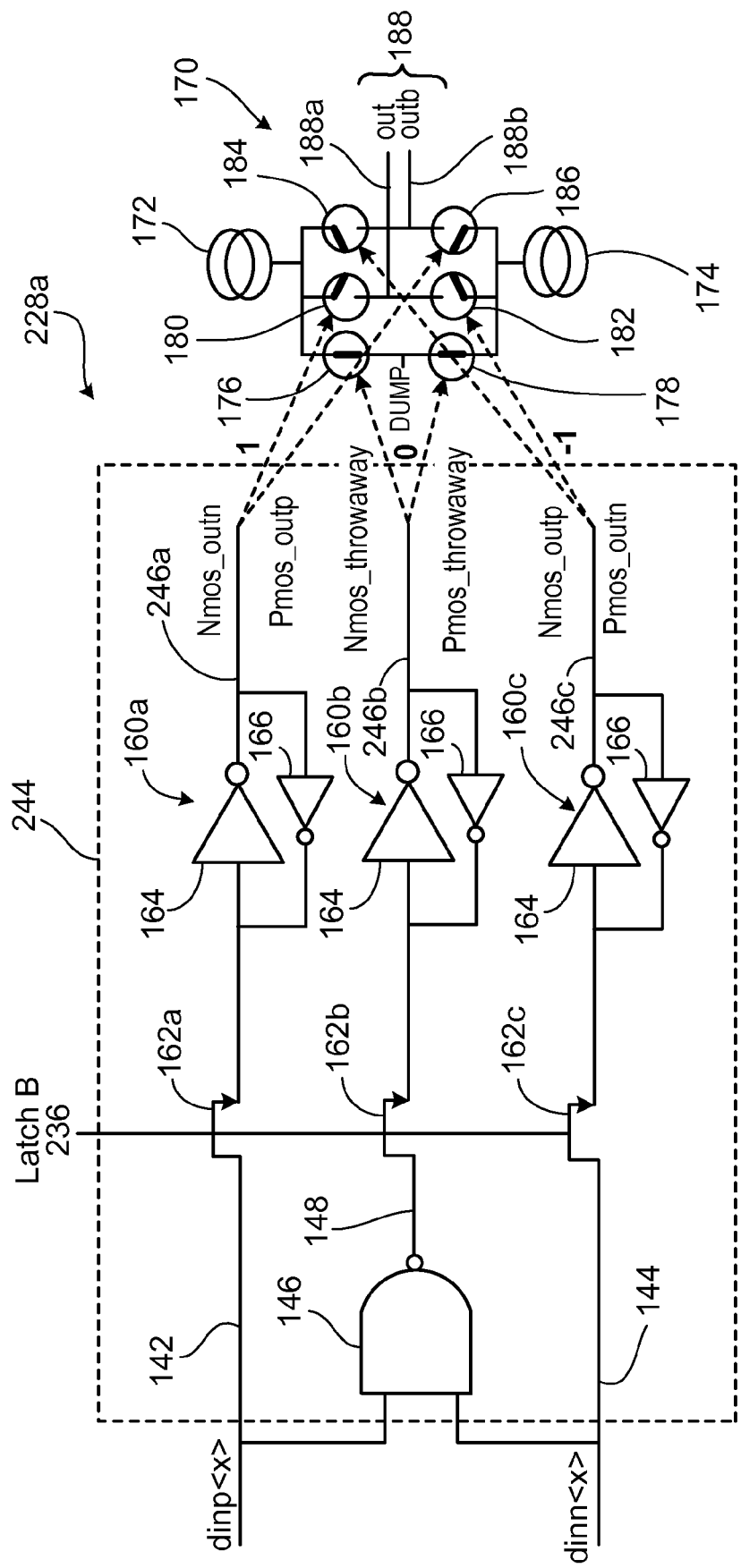
FIG. 6 is a diagram of an example DAC cell.

Referring to FIG. 6, the first phase DAC cell 228a (see FIG. 4) includes a control logic circuit 244 that receives the positive and negative thermometer signals dinp<x> 142 and dinn<x> 144, and generates control signals 246a, 246b, and 246c to control transistor switches of a tri-level current steering circuit 170. The signals dinp<x> 142 and dinn<x> 144 are sent to an NAND gate 146, which generates a signal 148. The signals 142, 148, and 144 are latched by latches 160a, 160b, and 160c, respectively, when switches 162a, 162b, and 162c, respectively, are turned on. The latches 160a, 160b, and 160c are collectively referenced as 160, and the switches 162a, 162b, and 162c are collectively referenced as 162.

For example, the switches 162a, 162b, and 162c can be metal-oxide-semiconductor field-effect transistors (MOSFETs) whose gate electrodes are controlled by a LatchB signal, which can be the clock signal 236 (FIG. 4). Each latch 160 can include a first inverter 164 and a second inverter 166, in which the second inverter 166 can be a weak inverter. At each cycle of the clock signal 236, the latches 160a to 160c latch and retain the values of the signals 142, 148, and 144. The outputs 246a to 246c of the latches 160a to 160c drive the tri-level current steering circuit 170 that can generate outputs representing a positive signal (e.g., +1), a negative signal (−1), and zero. The latch function can also be achieved with another type of latch cell while retaining the logical integrity of the circuit.

The circuit 170 includes a current source 172, a current sink 174, and switches 176 to 186. The circuit 170 generates differential output signals on a pair of signal lines out 188a and outb 188b, collectively referenced as 188. To generate an output representing +1, the switches 180 and 186 are closed while the other switches are open, so that current flows from the current source 172 through the switch 180 to the signal line out 188a, and current flows from the signal line outb 188b through the switch 186 to the current sink 174. To generate an output representing −1, the switches 182 and 184 are closed while the other switches are open, so that current flows from the current source 172 through the switch 184 to the signal line outb 188b, and current flows from the signal line out 188a through the switch 182 to the current sink 174. To generate an output representing 0, the switches 176 and 178 are closed while the other switches are open, so that current flows from the current source 172 through the switches 176 and 178 to the current sink 174, bypassing the signal lines 188.

The second phase DAC cell 228b (FIG. 4) has the same configuration as the first phase DAC cell 288a. The second phase DAC cell 228b also has three switches 162a to 162c that, when closed, allow corresponding latches 160a to 160c to latch the positive thermometer signal 142, the negative thermometer signal 144, and the NAND of the positive and negative signals 148. The latched signals are used to drive transistor switches 176 to 186 to control steering of current from positive current source 172 and negative source 174.

The latches of the second phase DAC cell 228b are controlled by the same control signal LatchB 236 that is used to control the latches of the first phase DAC cell 228a. Because the signals dinp 142 and dinn 144, and the time-delayed version of the signals dinp 142 and dinn 144 are latched in the first phase DAC cell 228a and second phase DAC cell 228b, respectively, in a synchronous manner, there will be no or little error due to clock jitter when adding the analog outputs of the first phase DAC cell 228a and the second phase DAC cell 228b.

In this example, each of the thermometer signals dinp and dinn is a parallel 8-bit signal. The DAC cell 228a includes eight control logic circuits 244 and eight tri-level current steering circuits 170. Each control logic circuit 244 and tri-level current steering circuit 170 converts one pair of positive and negative thermometer signal codes dinp<x> 142 and dinn<x> 144 to an analog signal. Similarly, the DAC cell 228b includes eight control logic circuits 244 and eight tri-level current steering circuits 170. Each control logic circuit 244 and tri-level current steering circuit 170 converts one pair of delayed positive and negative thermometer signal codes dinp<x> 142 and dinn<x> 144 to an analog signal. The eight analog signals from the DAC cell 228a and the eight analog signals from the DAC cell 228b are summed by the adder 122.

In this example, the transistors 176 to 186 are all NMOS transistors. NMOS transistors 176, 180, and 184 are used to steer current from the positive current source 172, and NMOS transistors 178, 182, and 186 are used to steer current to the negative current source 174. Using NMOS transistors to steer currents from both the positive and negative current sources 172 and 174 allows the control logic circuit 244 to be simple, as compared to the control logic circuit that would be needed if PMOS transistors were used to steer current from the positive current source 172.

The DAC module 230 can be used in, for example, a segmented sigma delta DAC. A segmented sigma delta DAC may include a sample rate converter and digital interpolator that over-samples a digital input. For example, the digital input can be a 20-bit signal having a frequency of 48 kHz. The over-sampled data can be sent to a multi-bit modulator, which outputs a 6-bit signal that is sent to a digital first-order modulator. The interpolator and the modulator can both be synchronized by a clock signal having a frequency of, e.g., 6.5 MHz.

A segmented DAC scheme can be used in which the digital first-order modulator outputs a first digital signal representing the lower bits (or finer portions) of the 6-bit digital signal, and a second digital signal representing the higher bits (or coarser portions) of the 6-bit digital signal. For example, the first digital signal can be 3-bit wide, and the second digital signal can be 4-bit wide.

The first digital signal can be converted to thermometer codes by a thermometer encoder and scrambled by a scrambler to generate, e.g., an 8-bit encoded signal. The 8-bit encoded signal can be converted to first analog components using a first digital to analog converter. Similarly, the second digital signal can be converted to thermometer codes by another thermometer encoder and scrambled by another scrambler to generate, e.g., a 16-bit encoded signal. The 16-bit encoded signal can be converted to second analog components using a second digital to analog converter that has four times the size of the first digital to analog converter. This is because the 16-bit encoded signal represents the higher bits of the 6-bit digital signal and the 8-bit encoded signal represents the lower bits of the 6-bit digital signal.

For example, each of the first and second digital to analog converters can have a configuration similar to the DAC module 230 of FIG. 4, with the current sources (e.g., 172 and 174 of FIG. 6) properly sized. The first and second analog components, derived from the 8-bit and 16-bit encoded signals, respectively, can be added by an adder, which outputs an analog signal that represents an analog version of the digital input.

The DAC modules 100 and 230 can also be used in, for example, a non-segmented sigma delta DAC, in which the 6-bit digital signal is thermally encoded, scrambled, and converted to an analog signal without using the segmented DAC scheme.

It should be appreciated that various aspects of the present invention may be may be used alone, in combination, or in a variety of arrangements not specifically discussed in the implementations described in the foregoing and is therefore not limited in its application to the details and arrangement of components set forth in the foregoing description or illustrated in the drawings.

Although some examples have been discussed above, other implementations and applications are also within the scope of the following claims. For example, the number of bits in the input digital signal and the frequencies of the signals can be different from those described above. The various components described above may be implemented in hardware, firmware, software or any combination thereof.

The tri-level elements can be encoded differently from what is shown in FIG. 5, and the control logic circuit 244 can be different from the one described above. For example, the NAND gate 146 can be replaced by a NOR gate with additional inverters on the positive and negative signal chains if the encoding were chosen according to a different scheme shown in a table 250 of FIG. 7, in which (Dinp, Dinn)=(0, 0)

represents 0, (Dinp, Dinn)=(0, 1) represents −1, (Dinp, Dinn) =(1, 0) represents +1, and (Dinp, Dinn)=(1, 1) is an illegal code.

Another encoding scheme for the tri-level elements is shown in a table 260 of FIG. 8, in which (Dinp, Dinn)=(0, 0) represents −1, (Dinp, Dinn)=(1, 0) represents 0, (Dinp, Dinn) =(1, 1) represents +1, and (Dinp, Dinn)=(0, 1) is an illegal code. One inverter in addition to the NAND gate 146 is used.

What is claimed is:

1. An apparatus comprising:
   a digital to analog converter (DAC) module to receive an input digital signal having a first data rate and is associated with a first frequency, the DAC module also receiving a synchronization signal having a second frequency that is higher than the first frequency, the DAC module comprising:
   an up-sampling circuit to generate a first digital signal having bit values of the input digital signal alternating with zero values, the first digital signal having a data rate that is higher than the first data rate;
   a delay circuit to delay the first digital signal by a time period to generate a second digital signal;
   a first DAC cell to generate a first analog signal based on the first digital signal, the first DAC cell being synchronized by the synchronization signal;
   a second DAC cell to generate a second analog signal based on the second digital signal, the second DAC cell being synchronized by the synchronization signal; and
   an adder to sum the first and second analog signals and generate a third analog signal;
   wherein the first DAC cell comprises a first latch unit to latch the first digital signal, the second DAC cell comprises a second latch unit to latch the second digital signal, and timing of latching the first digital signal by the first latch unit and timing of latching the second digital signal by the second latch unit are controlled by a same control signal.

2. The apparatus of claim 1 in which the control signal comprises the synchronization signal.

3. The apparatus of claim 1 in which the first DAC cell comprises a current steering circuit to steer a current from a current source based on the first digital signal to generate the first analog signal.

4. The apparatus of claim 3 in which the current steering circuit comprises NMOS transistors for steering currents from a positive current source and NMOS transistors for steering currents to a negative current source.

5. The apparatus of claim 4, further comprising a logic circuit to receive the input digital signal and generate control signals for controlling the NMOS transistors to affect steering of the currents.

6. The apparatus of claim 1 in which the synchronization signal comprises a clock signal, and the delay circuit delays the first digital signal by one clock cycle of the clock signal.

7. The apparatus of claim 1 in which the first DAC cell comprises a tri-level current source.

8. The apparatus of claim 1 in which the up-sampling circuit comprises a multiplexer that receives the input digital signal and a zero value signal, and alternately outputs the digital signal and the zero value signal.

9. An apparatus comprising:
   a digital to analog converter (DAC) module to receive an input digital signal and a synchronization signal, the DAC module comprising:
   a first circuit to sample a first digital signal and a second digital signal synchronously according to the synchronization signal, the first digital signal having bit values of the input digital signal alternating with zero values, the second digital signal being a time-delayed version of the first digital signal; and
   a second circuit to convert the first and second digital signals into first and second analog signals, and to combine the first and second analog signals to generate a third analog signal;
   wherein the first circuit comprises a first latch unit to latch the first digital signal and a second latch unit to latch the second digital signal, the timing of latching the first digital signal by the first latch unit and timing of latching the second digital signal by the second latch unit are controlled by the synchronization signal.

10. The apparatus of claim 9 in which the input digital signal has a first data rate and is associated with a frequency, and the synchronization signal has a second frequency that is twice the first frequency.

11. An apparatus comprising:
    a digital to analog converter (DAC) module to receive an input digital signal having a first data rate and is associated with frequency, the DAC module also receiving a clock signal having a clock frequency that is higher than the first frequency, the DAC module comprising:
    at least one DAC unit, each DAC unit comprising:
    a first current source,
    a second current source,
    a first control circuit to steer current from the first current source according to a first digital signal that comprises bit values of the input digital signal interleaved with zero values, the first control circuit being synchronized according to the clock signal, and
    a second control circuit to steer current from the second current source according a second digital signal that comprises the first digital signal delayed by a time period, the second control circuit being synchronized according to the clock signal.

12. The apparatus of claim 11 in which the first control circuit comprises a first latch unit to latch the first digital signal, the second control circuit comprises a second latch unit to latch the second digital signal, and timing of latching the first digital signal by the first latch unit and timing of latching the second digital signal by the second latch unit are controlled by a same latch control signal.

13. The apparatus of claim 12 in which the latch control signal comprises the clock signal.

14. The apparatus of claim 11 in which each DAC unit converts one bit in the input digital signal to analog components.

15. The apparatus of claim 11 in which the combination of the first current source and the first control circuit comprises a first tri-level current steering circuit, and the combination of the second current source and the second control circuit comprises a second tri-level current steering circuit.

16. The apparatus of claim 11 in which the DAC module combines the currents steered from the first and second current sources to form an analog output signal.

17. The apparatus of claim 11 in which the first control circuit and the second control circuit are synchronized according to same edges of the clock signal.

18. The apparatus of claim 11 in which the first control circuit receives the first digital signal and generates control signals to control switches that steer the current from the first current source.

19. The apparatus of claim 11 in which the first digital signal comprises a bit value from a scrambled thermometer code.

20. An apparatus comprising:
a sigma-delta modulator to receive a parallel input bit stream and generate an over-sampled bit stream having a data rate higher than that of the input bit stream and a number of parallel bits lower than that of the input bit stream;
a thermometer encoder to encode the over-sampled bit stream to generate a thermometer coded bit stream;
a plurality of weighted digital to analog units each to generate an analog representation of one or more bits of the thermometer coded bit stream, the weighted digital to analog unit comprising
a first logic circuit synchronized to a clock signal twice the frequency of the thermometer coded bit stream to control a first source according to a first digital signal that comprises bit values of the corresponding bit of the thermometer coded bit stream interleaved with zero values, and
a second logic circuit synchronized to the clock signal to control a second source according to a second digital signal that comprises the first digital signal delayed by a time period.

21. An apparatus comprising:
a digital to analog converter (DAC) to receive input digital data and generate a corresponding analog tri-level output signal, the DAC comprising:
a tri-level component comprising at least one current source and transistor switches to steer current in one of three ways, the transistor switches all being of a same polarity type; and
a logic circuit to receive the input digital data and generate control signals to control the transistor switches to cause the tri-level component to output the analog tri-level output signal, wherein the logic circuit generates a first signal that controls a first transistor switch and a second transistor switch, a second signal that controls a third transistor switch and a fourth transistor switch, and a third signal that controls a fifth transistor switch and a sixth transistor switch.

22. The apparatus of claim 21 in which the tri-level component comprises NMOS transistors to steer current from both positive and negative current sources.

23. The apparatus of claim 21 in which the logic circuit comprises three latches to hold values of input digital data and three latch control switches to control when the three latches receive new input digital data, the values of input data held by the three latches corresponding to the first, second, and third signals, respectively.

24. An apparatus comprising:
a digital to analog converter (DAC) to receive input digital data and generate a corresponding analog tri-level output signal, the DAC comprising:
a tri-level component comprising at least one current source and transistor switches to steer current in one of three ways, the transistor switches all being of a same polarity type; and
a logic circuit to receive the input digital data and generate control signals to control the transistor switches to cause the tri-level component to output the analog tri-level output signal, wherein the logic circuit comprises a first input to receive a first digital data, a second input to receive a second digital data, and one or more logic gates to generate a third digital data based on the first and second digital data, and wherein the first, second, and third digital data have specific values that correspond to each of three possible levels of the analog tri-level output signal.

25. A method of converting a digital code to an analog signal, the method comprising:
receiving an input digital signal having a first data rate and is associated with a first frequency;
generating a first digital signal that comprises bit values of the input digital signal interleaved with zero values and having a second data rate that is higher than the first data rate;
delaying the first digital signal by a time period to generate a second digital signal;
latching the first digital signal to generate a first latched digital signal;
latching the second digital signal to create a second latched digital signal;
synchronizing the latching of the first digital signal and the latching of the second digital signal by using a synchronization signal;
converting the first latched digital signal to a first analog signal;
converting the second latched digital signal to a second analog signal; and
combining the first and second analog signals.

26. A method comprising:
receiving an input digital signal and a synchronization signal;
generating a first digital signal having bit values of the input digital signal alternating with zero values;
delaying the first digital signal to generate a second digital signal;
sampling the first digital signal and the second digital signal synchronously according to the synchronization signal, the sampling comprising:
latching the first digital signal to generate the first sampled signal,
latching the second digital signal to generate the second sampled signal, and
synchronizing the latching of the first digital signal and the latching of the second digital signal by using a synchronization signal;
converting the first and second sampled signals into first and second analog signals; and
combining the first and second analog signals to generate a third analog signal.

27. The apparatus of claim 24 in which the tri-level component comprises NMOS transistors to steer current from both positive and negative current sources.

* * * * *